United States Patent [19]

Fitzpatrick et al.

[11] Patent Number: 5,015,328
[45] Date of Patent: May 14, 1991

[54] METHOD OF REDUCING SURFACE DAMAGE IN KTP OPTICAL WAVEGUIDES

[75] Inventors: Brian J. Fitzpatrick, Ossining; Phyllis M. Harnack, Hastings on Hudson, both of N.Y.

[73] Assignee: North American Philips Corporation, New York, N.Y.

[21] Appl. No.: 407,378

[22] Filed: Sep. 14, 1989

[51] Int. Cl.⁵ .............................................. C30B 19/12
[52] U.S. Cl. ........................... 156/624; 156/DIG. 71; 156/DIG. 75; 156/DIG. 81; 156/625; 156/628; 350/96.12; 350/96.15; 350/96.3; 134/22.16; 134/26; 437/225
[58] Field of Search ....... 156/624, DIG. 71, DIG. 75, 156/DIG. 81, 607, 623 R, 625, 628; 350/96.12, 96.15, 96.3, 96.34; 427/164; 134/22.16, 26; 437/225

[56] References Cited

U.S. PATENT DOCUMENTS 3,949,323  4/1976  Bierlein et al. ................. 156/623 R
4,740,265  4/1988  Bierlein et al. ....................... 156/624
4,766,954  8/1988  Bierlein et al. ....................... 156/624

Primary Examiner—Gary P. Straub
Assistant Examiner—R. Bruce Breneman
Attorney, Agent, or Firm—Norman N. Spain

[57] ABSTRACT

A method for producing an optical waveguide which comprises immersing a wafer of $K_{1-x}Rb_xTiOMO_4$, wherein $0 \leq x \leq 1$, and M is P or As, for 1-64 hours in molten potassium nitrate at 400°-500° C., followed by washing and immersing in a molten salt of Rb, Cs, or Tl at 240°-335° C., thereby causing the Rb, Cs, or Tl to replace the K or Rb cations. The resultant product has reduced mechanical damage to the waveguide surface.

8 Claims, 1 Drawing Sheet

METHOD OF REDUCING SURFACE DAMAGE IN KTP OPTICAL WAVEGUIDES

BACKGROUND OF THE INVENTION

This invention relates to an improved method for the production of an optical waveguide of the type disclosed in Bierlein et al U.S. Pat. Nos. 4,740,265 and 4,766,954.

In these patents a method is disclosed for producing an optical waveguide by contacting an optically smooth surface of a thin wafer cut from a crystal of $K_{1-x}Rb_x\text{TiOMO}_4$ where $0 \leq x \leq 1$ and M is P or As with a molten salt of at least one of Rb, Cs and Tl. The wafer is cut so that its Z axis is perpendicular to the optically smooth surface. The crystal is treated with the molten salt at a temperature of about 200° C. to about 600° C. The crystal is treated with the molten salt for a time sufficient to increase the surface index of refraction at least about 0.00025 relative to the index of refraction of the starting crystal.

Particularly useful waveguides are those formed from crystals of $KTiOPO_4$ hereinafter termed KTP.

In a high proportion of waveguides produced by the methods of the above-mentioned patents defects have been observed. This is shown by light scattering that frequently is observed during the testing of these waveguides.

It has been found that an important cause of these defects is mechanical damage to the optically smooth crystal surface that is present before treatment with the thallium salt. These are scratches or other surface damages resulting from cutting, lapping or polishing of the crystal.

SUMMARY OF THE INVENTION

A principal object of this invention is to provide a method for the production of the waveguides of the aforementioned type in which mechanical damage to the smooth surface is drastically reduced.

This and other objects of the invention will be apparent from the description that follows.

According to the invention, optical waveguides are produced from single crystals of materials of the formula $K_{1-x}Rb_x\text{TiOMO}_4$ wherein $0 \leq x \leq 1$ and M is P or As, when the crystal is cut in such a manner so as to produce a thin wafer having an optically smooth surface perpendicular to the Z axis of the wafer. The wafer is immersed in molten potassium nitrate heated to 400° C.–500° C. for a period of 1–64 hours. The wafer is then removed from the molten potassium nitrate and the potassium nitrate is washed from the wafer. The wafer is then subjected, for about 10 minutes to 4 hours to the action of at least one molten salt of a metal selected from the group consisting of Rb, Cs and Tl heated to 240° C.–335° C. to thereby cause the K or Rb cation present in the optically smooth surface to be substituted by a cation selected from the group consisting of Rb, Cs, and Tl to a depth of 0.6 μm –8 μm.

It is found that optically smooth surfaces of the wafers produced according to the claimed method exhibit significantly decreased mechanical damage compared to the particularly smooth surface of wafers prepared according to the prior art. As a result it has been found that the light scattering caused by mechanical damage is drastically reduced.

DETAILED DESCRIPTION OF THE INVENTION

For a better understanding, the invention will now be described in greater detail.

The method of the instant invention is useful for the production of waveguides formed of all material of the formula $K_{1-x}Rb_x\text{TiOMO}_4$. It is particularly useful in the case where $x=0$ and especially where the wafer treated is a wafer of a crystal of $KTiOPO_4$ (KTP).

Any molten salt of Rb, Cs or Tl may be employed. However, it is found that the nitrates are particularly useful. It is found that thallium nitrate is particularly preferred.

A wafer of any thickness up to about 2 mm thickness may be used. However, it has been found that the best results have been achieved when the thickness of the wafer is from 0.5–0.8 mm thick.

A preferred embodiment of the invention will now be described with reference to the following examples.

EXAMPLE 1A

A 5×8 mm wafer of a thickness of 0.8 mm was cut from a single crystal of KTP in such a manner so as to provide an optically smooth surface perpendicular to the Z axis. The wafer is immersed in molten potassium nitrate heated to 450° C. for an hour. The wafer was then removed from the molten potassium nitrate. Any potassium nitrate on the optically smooth surface of the wafer was then removed by washing the wafer with ion-free water. After removing the potassium nitrate the wafer was then immersed in molten thallium nitrate heated to 300° C. for 1 hour.

COMPARATIVE EXAMPLE 1B

A second optical waveguide was produced from a wafer of the same dimensions cut from the same crystal of KTP. The wafer was treated in an identical fashion except that the step of treating the wafer with the molten potassium nitrate was eliminated.

Figure 1A:
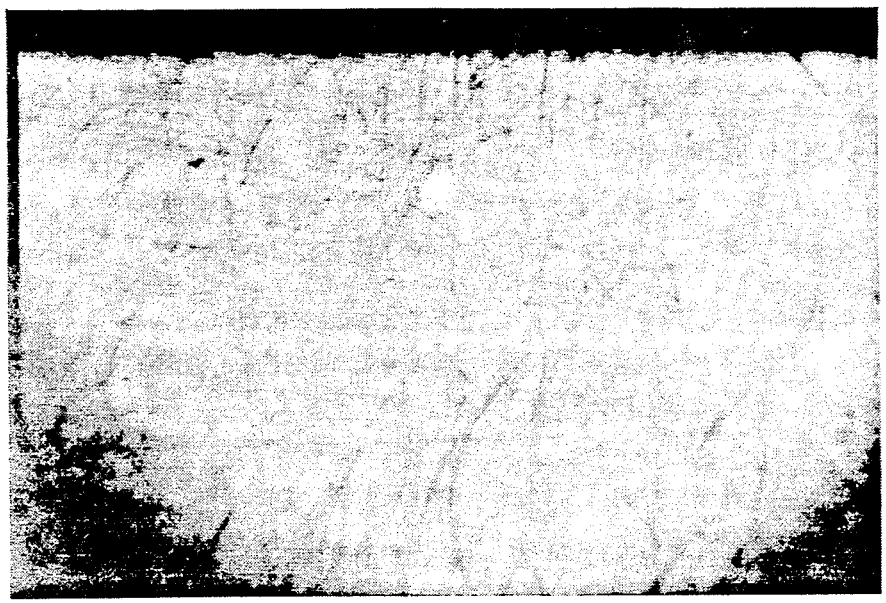
FIG. 1a of the drawing is a photograph magnified 50 times of an optically smooth surface of an optical waveguide produced in a wafer cut from a single crystal of KTP according to the method of the prior art.
Figure 1B:
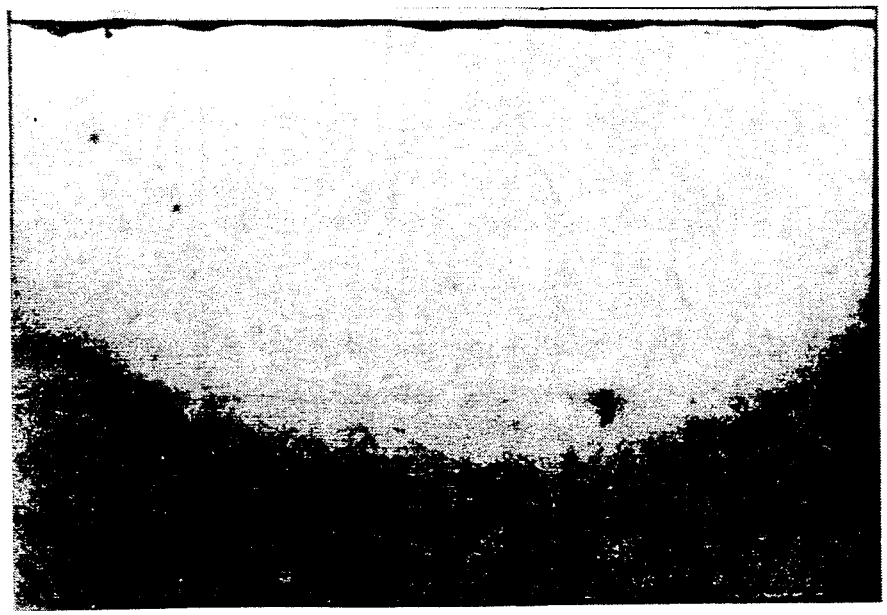
FIG. 1b is a photograph magnified 50 times of an optically smooth surface of a waveguide produced by a wafer cut from a crystal of KTP according to the method of the invention.

FIG. 1a is a photograph of a thallium nitrate treated optically smooth surface of a waveguide produced according to Example 1A. FIG. 1b is a photograph of the thallium nitrate treated optically smooth surface of a waveguide produced according to the method of the comparative Example 1B.

As will be noticed by comparing these photographs, which have been magnified 50 times, there is a significant decrease in physical damage to the optically smooth surface of the optical waveguide produced by the method of the invention as compared to that produced by the method of the comparative example.

The improvement resulting from the use of the method of the invention has also been found to result in a significant decrease in light scattering as compared to the optical waveguide produced by the method of the comparative example.

What is claimed is:

1. A method of producing an optical waveguide comprising:
   (a) immersing a thin wafer of a material of the formula $K_{1-x}Rb_xTiOMO_4$ wherein $0 \leq x < 1$ and M is P or As, having an optically smooth surface and cut from a single crystal of said material in a manner such that the Z axis of said wafer is perpendicular to said optically smooth surface, for 1–64 hours in molten potassium nitrate heated to 400° C.–500° C.,
   (b) removing said wafer from said molten potassium nitrate,
   (c) washing away potassium nitrate from said wafer, and
   (d) subjecting said wafer for about 10 minutes to 4 hours to the action of at least one molten salt of a metal selected from the group consisting of Rb, Cs and Tl heated to 240° C.–335° C. to thereby cause said cation selected from the group consisting of Rb, Cs and Tl to replace K or Rb cations at said optically smooth surface and extending into said wafer to a depth of 0.6 µm–8 µm.

2. The method of claim 1 wherein $x=0$.

3. The method of claim 2 wherein the wafer is a wafer of $KTiOPO_4$.

4. The method of claim 3 wherein the molten salt is a nitrate.

5. The method of claim 4 wherein the molten salt is thallium nitrate.

6. The method of claim 5 wherein the wafer is 0.5 mm–0.8 mm thick.

7. The method of claim 6 wherein the wafer is immersed for about 1 hour in the molten potassium nitrate heated to about 450° C.

8. The method of claim 7 wherein the wafer is subjected to treatment for about 1 hour by molten thallium nitrate heated to about 300° C.

* * * * *